United States Patent
Yeo et al.

(10) Patent No.: US 10,408,019 B2
(45) Date of Patent: Sep. 10, 2019

(54) THERMOELECTRIC GENERATOR FOR USE WITH WELLBORE DRILLING EQUIPMENT

(71) Applicant: Halliburton Energy Services, Inc., Houston, TX (US)

(72) Inventors: Shi Jing Yeo, Singapore (SG); Jun Wei Ang, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 220 days.

(21) Appl. No.: 15/122,884

(22) PCT Filed: Jun. 24, 2015

(86) PCT No.: PCT/US2015/037516
§ 371 (c)(1),
(2) Date: Aug. 31, 2016

(87) PCT Pub. No.: WO2016/118185
PCT Pub. Date: Jul. 28, 2016

(65) Prior Publication Data
US 2017/0107795 A1    Apr. 20, 2017

(30) Foreign Application Priority Data

Jan. 22, 2015    (SG) .......................... 10201500517R

(51) Int. Cl.
*E21B 41/00*    (2006.01)
*H01L 35/20*    (2006.01)
*H01L 35/32*    (2006.01)

(52) U.S. Cl.
CPC .......... *E21B 41/0085* (2013.01); *H01L 35/20* (2013.01); *H01L 35/32* (2013.01)

(58) Field of Classification Search
CPC ...... E21B 41/0085; E21B 41/00; E21B 43/00; H01L 35/00–325; H02N 11/002; H02J 7/34; H02J 7/345
See application file for complete search history.

(56) References Cited

U.S. PATENT DOCUMENTS

| | | | |
|---|---|---|---|
| 5,929,372 A | 7/1999 | Oudoire et al. | |
| 5,939,667 A * | 8/1999 | Oudoire ............. | E21B 33/0355 136/205 |
| 6,150,601 A * | 11/2000 | Schnatzmeyer .... | E21B 41/0085 136/201 |
| 7,208,845 B2 | 4/2007 | Masters et al. | |
| 7,755,235 B2 | 7/2010 | Main | |
| 7,762,354 B2 | 7/2010 | Garcia-Osuna | |
| 7,770,645 B2 | 8/2010 | Jeffryes | |
| 8,033,328 B2 | 10/2011 | Hall et al. | |

(Continued)

OTHER PUBLICATIONS

International Search Report and Written Opinion of PCT Application No. PCT/US2015/037516 dated Sep. 21, 2015: pp. 1-18.

*Primary Examiner* — George S Gray
(74) *Attorney, Agent, or Firm* — Chamberlain Hrdlicka

(57) ABSTRACT

An electrical power thermoelectric power generation in a wellbore for supplying power and charging downhole loads. A power generation assembly includes at least one thermoelectric generator disposed in a drill string for supplying power and charging downhole tools, the assembly utilizing the heat energy from the drilling fluid flowing in an annulus of the wellbore to generate a voltage potential across the thermoelectric generator.

20 Claims, 6 Drawing Sheets

(56) References Cited

U.S. PATENT DOCUMENTS

| | | |
|---|---|---|
| 8,714,239 B2 | 5/2014 | Tosi et al. |
| 2005/0167098 A1* | 8/2005 | Lovell .................. E21B 17/003 166/248 |
| 2006/0213669 A1 | 9/2006 | Shipley et al. |
| 2007/0151591 A1 | 7/2007 | Jeffryes |
| 2008/0033653 A1* | 2/2008 | Pabon ..................... G01V 1/44 702/6 |
| 2009/0038848 A1* | 2/2009 | Garcia-Osuna ....... E21B 17/003 175/40 |
| 2010/0133006 A1* | 6/2010 | Shakra ............... E21B 41/0085 175/24 |
| 2014/0111136 A1* | 4/2014 | Cho .................... H02N 11/002 320/101 |

\* cited by examiner

THERMOELECTRIC GENERATOR FOR USE WITH WELLBORE DRILLING EQUIPMENT

BACKGROUND

This section is intended to introduce the reader to various aspects of art that may be related to various aspects of the presently described embodiments. This discussion is believed to be helpful in providing the reader with background information to facilitate a better understanding of the various aspects of the present embodiments. Accordingly, it should be understood that these statements are to be read in this light, and not as admissions of prior art.

The present invention relates generally to electrical power generation and, in an embodiment described herein, more particularly provides a downhole power generator that converts heat energy into a voltage potential usable for, inter alia, powering electronics and charging devices such as capacitors. The present disclosure is directed generally to the generation of power downhole to support higher power demands experienced during modern wellbore drilling.

Modern hydrocarbon drilling and production operations can often require that electrical power be supplied to equipment in the downhole environment. For example, electrical power is required downhole for a number of applications, including well logging and telemetry. Well logging of the borehole often includes the use of active sensors that require power to obtain information about the downhole environment. Such information will typically include the various characteristics and parameters of the earth formations traversed by the borehole, data relating to the size and configuration of the borehole itself, pressures and temperatures of ambient downhole fluids, and other vital downhole parameters. Telemetry commonly utilizes electrical power to relay data acquired from various logging sensors in the downhole environment to the surface. As technology advances with newer and better tools, the power demanded by the tools increases in order to keep the tools running in the wellbore for long periods of time.

One conventional approach to downhole electrical power generation includes circulating drilling mud to operate a generator or turbine located downhole. At least one problem with this approach is that mud flow rates can vary widely and the mud flow may need to be increased, for example when the drill bit enters a new type of subterranean strata. As the flow rate becomes excessively high, significant issues can be encountered. First, at high flow rates, the increased rotational rate produces high torques within the generator that can lead to its mechanical failure. Second, at high flow rates, more power can be generated than is necessary for the intended application. This excess power generation can lead to heat production, which can be detrimental to electronic components in the drill string. Additionally, due to the potential extreme flow rates that the circulating mud may attain, any such generator or turbine is typically oversized relative to the nominal requirement for power. The increased size of the generator or turbine leads to lower than optimal efficiency and increased cost. A conventional approach to generating a constant amount of power when the mud flow must be increased is to pull the downhole generator and reconfigure the turbine to operate at the higher mud flow rate. Pulling, modifying, and re-inserting the downhole power generator requires a significant amount of time, thereby incurring an operational cost and delaying the drilling operation.

Another conventional approach to downhole electrical power generation is simply to place more batteries in the downhole tool or tolls being operated in the wellbore. However, the addition of batteries takes up valuable space on the tool itself as well as space on the drill string. Further, batteries are flammable, explosive and dangerous and harmful to the environment.

There continues to be a need for improved electrical power sources that can be used with wellbore drilling systems.

BRIEF DESCRIPTION OF THE DRAWINGS

Illustrative embodiments of the present disclosure are described in detail below with reference to the attached drawing figures, which are incorporated by reference herein and wherein.

Figure 1:
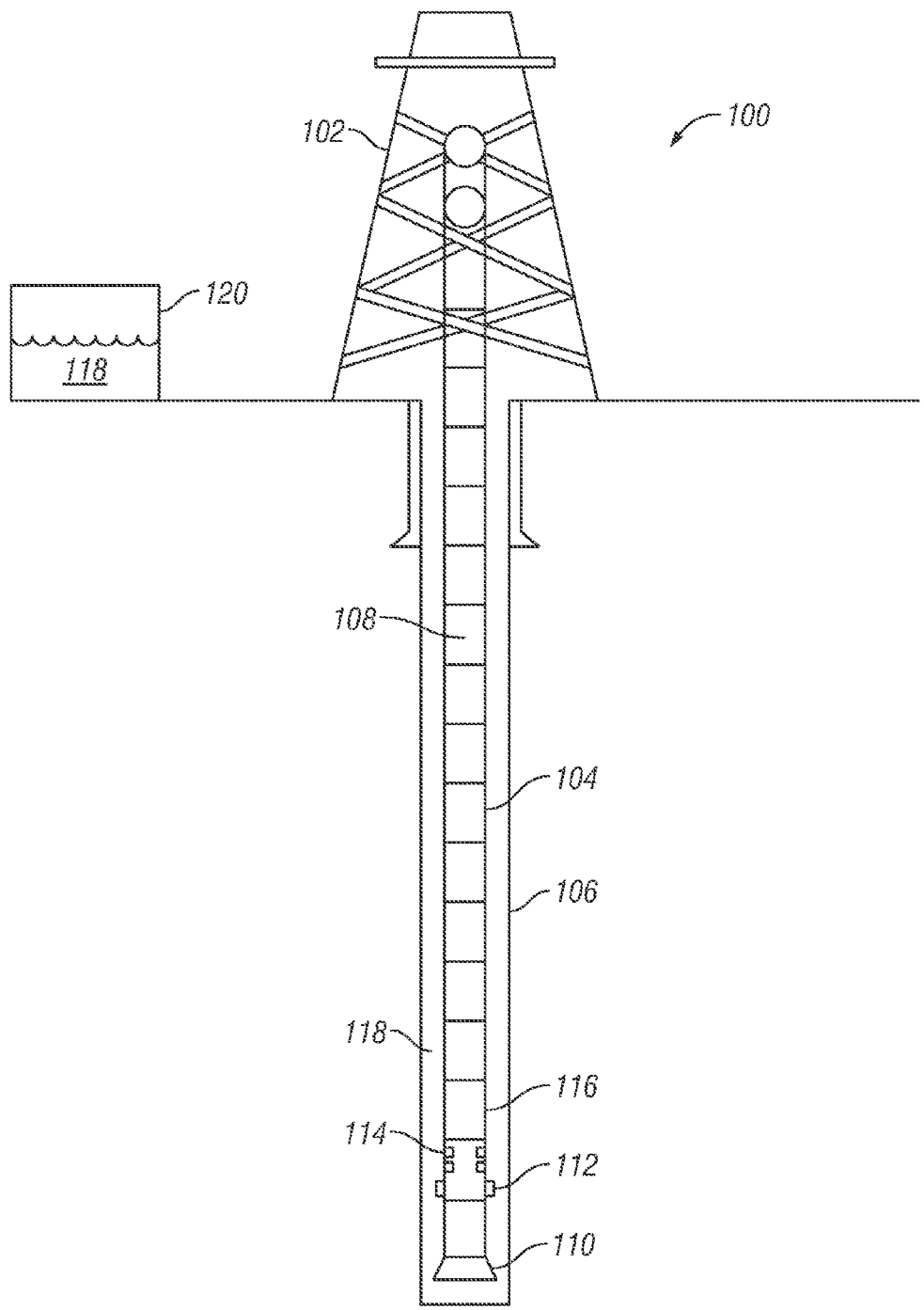
FIG. 1 is a schematic view of an example drilling system suitable for use with downhole power generators.

The illustrated figures are only exemplary and are not intended to assert or imply any limitation with regard to the environment, architecture, design, or process in which different embodiments may be implemented.

DETAILED DESCRIPTION OF ILLUSTRATIVE EMBODIMENTS

The following discussion is directed to various embodiments of the present disclosure. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed below may be employed separately or in any suitable combination to produce desired results. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but are the same structure or function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Turning now to the present figures, a typical onshore oil or gas drilling system 100 with which embodiments of the invention may be used is shown schematically in FIG. 1. The wellbore drilling system 100 is described in terms of an onshore drilling system. However, it should be understood that certain aspects of the invention have application in any wellbore conduit system comprising an annulus through which fluid is moved, such as a completion or production system, whether onshore or offshore. Therefore, the invention is not limited in scope for use only with onshore drilling systems.

The drilling system 100 includes a drilling rig 102, or other similar device for lifting and supporting a conduit, which suspends a drill string 104 within a wellbore 106 being drilled through a subsurface formations. An annular space 118 is formed between the drill string 104 and the wellbore 106. The illustrated drill string 104 comprises segments or joints 108 of drill pipe. The drill string 104 may include a drill bit 110 at its lower end. The drill bit 110 is moved axially into the wellbore 106 by rotating equipment on the drilling rig 102, such as a top drive, or by rotating equipment located in the drill string, such as a drilling or mud motor. Rotation of the drill bit 110 causes the bit 110 to extend the wellbore 106.

The lower end of the drill string 104 may include, at a selected position above and proximate to the drill bit 110, a wear band 112 for decreasing the wear around the outer diameter of the drill string 104. The drill string 104 may further include, at a selected position above and proximate to the wear band 112, one or more power generators 114 arranged on a power generator sub according to various aspects of the invention and which will be further explained below. In the embodiment illustrated in FIG. 1, two power generators 114 are shown in parallel. Proximate the drill bit 110 and wear band 112 may also be one or more tools 116 for providing measurements and imaging of the borehole 106. A portion, or all, of the electrical power required to operate the tool 116 may be obtained from the power generator 114.

During drilling operations, drilling fluid 118 such as mud is pumped from a tank 120, or pit, into the interior of the drill string 104. The mud 118 travels the length of the drill string 104 and exits the drill string 104 through openings in the drill bit 110. The mud cools and lubricates the drill bit 110 and lifts drill cuttings generated by the drill bit 110 to the surface.

Figure 2:
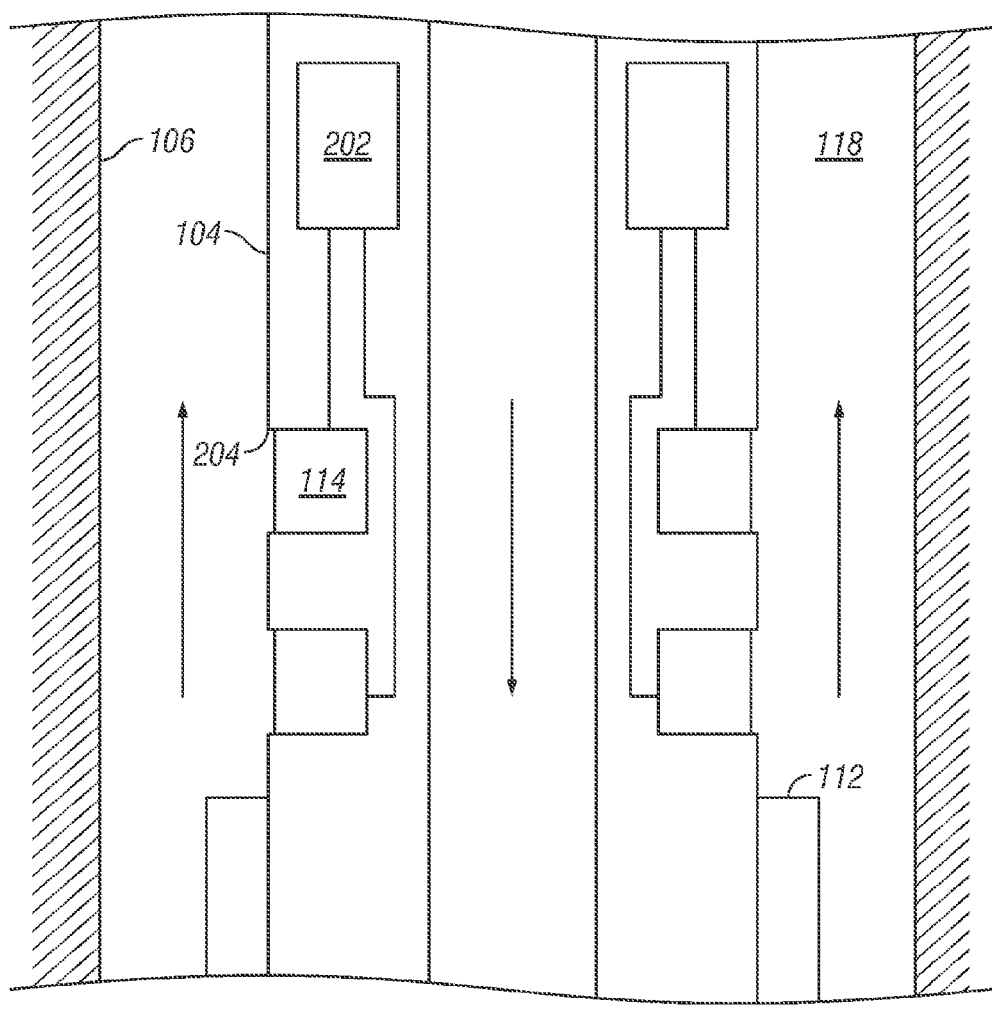
FIG. 2 is a cross-sectional view of an embodiment of a power generator sub.

A cross-section of an example of a power generator sub is illustrated in FIG. 2. In the illustrated embodiment, power generators 114 are disposed on a power generator sub on the drill string 104 in cavities 204. The power generators are seated in cavities 204 and are recessed from the outer surface of the drill string 104. In alternative embodiments, the power generators 114 may be flush with the surface of the drill string, or may protrude from the surface of the drill string 104 radially into the annular space between the drill string 104 and wellbore 106.

The power generators 114 may be directly exposed to the drilling fluid 118 which is circulating down the length of the drill string 104, exiting the drill string 104 through openings in the drill bit 110, and returning to the surface up the annular space 118 defined between the drill string 104 and the wellbore 106. In alternative embodiments, the power generators 114 may be exposed indirectly to the drilling fluid 118, i.e., there may be a material between the power generators 114 and drilling fluid 118. The power generators 114 are connected to one or more power condition units 202. The power conditioning units serve to improve the quality of the electrical power that is generated by the power generators 114 and delivered to a downhole tool or stored.

The power generators 114 are thermoelectric generators and comprise one or more thermoelectric materials to convert a heat gradient along the material into electrical power. Thermoelectric material generates a voltage potential in response to an applied temperature differential and, when in used in series with an electrical load, current and hence power are generated. When no current is drawn, a voltage potential is created that is proportional to the temperature differential, the coefficient of proportionality being the Seebeck coefficient. The Seebeck coefficient of a material is a measure of the magnitude of an induced thermoelectric voltage in response to a temperature difference across that material, as induced by the Seebeck effect. The Seebeck effect is a phenomenon in which the temperature-induced voltage potential called electromotive force (EMF) is generated when there is a temperature gradient along the length of material. When heat is applied at one end of the material, heated electrons flow from the hot end of the material to the cold end. If the material is connected through an electrical circuit, current flows through that circuit. The relationship between the EMF and the temperature difference can be represented as:

$$EMF = S \times \Delta T, \quad [1]$$

where EMF is the voltage potential of the cold end with respect to the hot end of the material, S is the Seebeck coefficient of the material, and $\Delta T$ is the temperature difference of the hot end with respect to the cold end. Because the voltage potential is proportional to the temperature differential, maximizing the temperature difference across the material is an important consideration in thermoelectric generator design.

Figure 3:
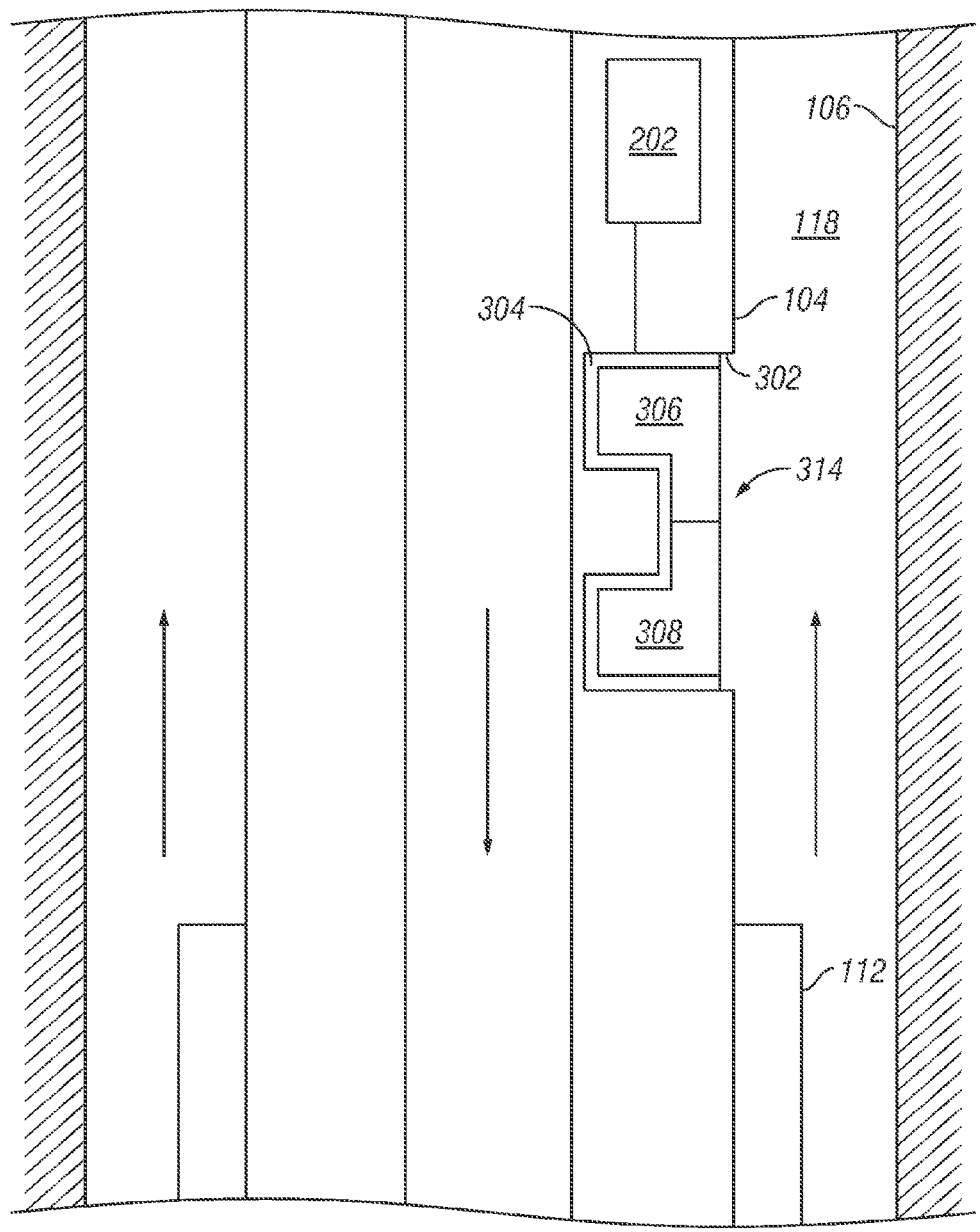
FIG. 3 is a cross-sectional view of an embodiment of a power generator sub including two materials with differing Seebeck coefficients.

A cross-section of an example of a power generator 314 is illustrated in FIG. 3. This example includes at least a U-shaped cavity 302 on the drill string 104. The cavity 204 is disposed in location proximate to wear band 112 to minimize erosion of the power generator sub from drilling fluid 118 flow. A thermal insulator 304 is disposed in the cavity 302. The thermal insulator 304 is preferably a non-metallic material. Non-limiting examples of such materials include polyamideimide, polyphenylene, or polyetherketone, and ceramics or ceramic composites like calcium silicate, fiber glass composite, or metal oxide. The thermal insulator 304 insulates the power generator 314, so that instead of heat being conducted around the power generator 314, it is preferentially conducted through the power generator 314.

Two differing materials 306 and 308 are disposed on the thermal insulator 304. Materials 306 and 308 should comprise different Seebeck coefficients, and preferably have a large Seebeck coefficient delta between each other. Non-limiting examples of such material combinations include metals, metal alloys, and highly-doped semiconductors. Non-limiting examples may include Chromel-Constantan, Chromel-Alumel and Nicrosil-Nisil.

The two differing materials A and B are joined at one end called the junction. The other ends of the materials are attached to the terminals of the power conditioning unit 202 by means of connecting wires. Extending Equation (1) to the power generator with two dissimilar materials in FIG. 3 gives:

$$EMF = \Delta S \times \Delta T, \qquad [2]$$

where EMF is the potential difference generated between the two ends of the dissimilar materials 306 and 308, $\Delta S$ is the absolute Seebeck coefficient of one material relative to the other, $S_A - S_B$, and $\Delta T$ is the temperature difference of the hot side with respect to the cold side. If the two materials have the same absolute Seebeck coefficients, i.e., $S_A = S_B$, then the power generator generates no EMF, regardless of the temperature difference.

During operation in the wellbore 106, heat is generated on the surface of the drill string 104. Accordingly, the junction of the two dissimilar materials 306 and 308 is relatively hotter than the other ends of each material 306 and 308. Due to the Seebeck effect, free electrons in both materials 306 and 308 diffuse from the hot side to the cold side. The free electrons in both dissimilar materials 306 and 308 diffuse at different speeds due to different Seebeck coefficients of materials 306 and 308, thus creating a potential difference between the two ends of the dissimilar materials 306 and 308. The potential difference created between the ends of the dissimilar materials 306 and 308 can be utilized to provide electrical power to a downhole tool or stored. In the illustrated embodiment, the electrical power generated in the power generator 314 is conditioned by power conditioning unit 202.

Figure 4:
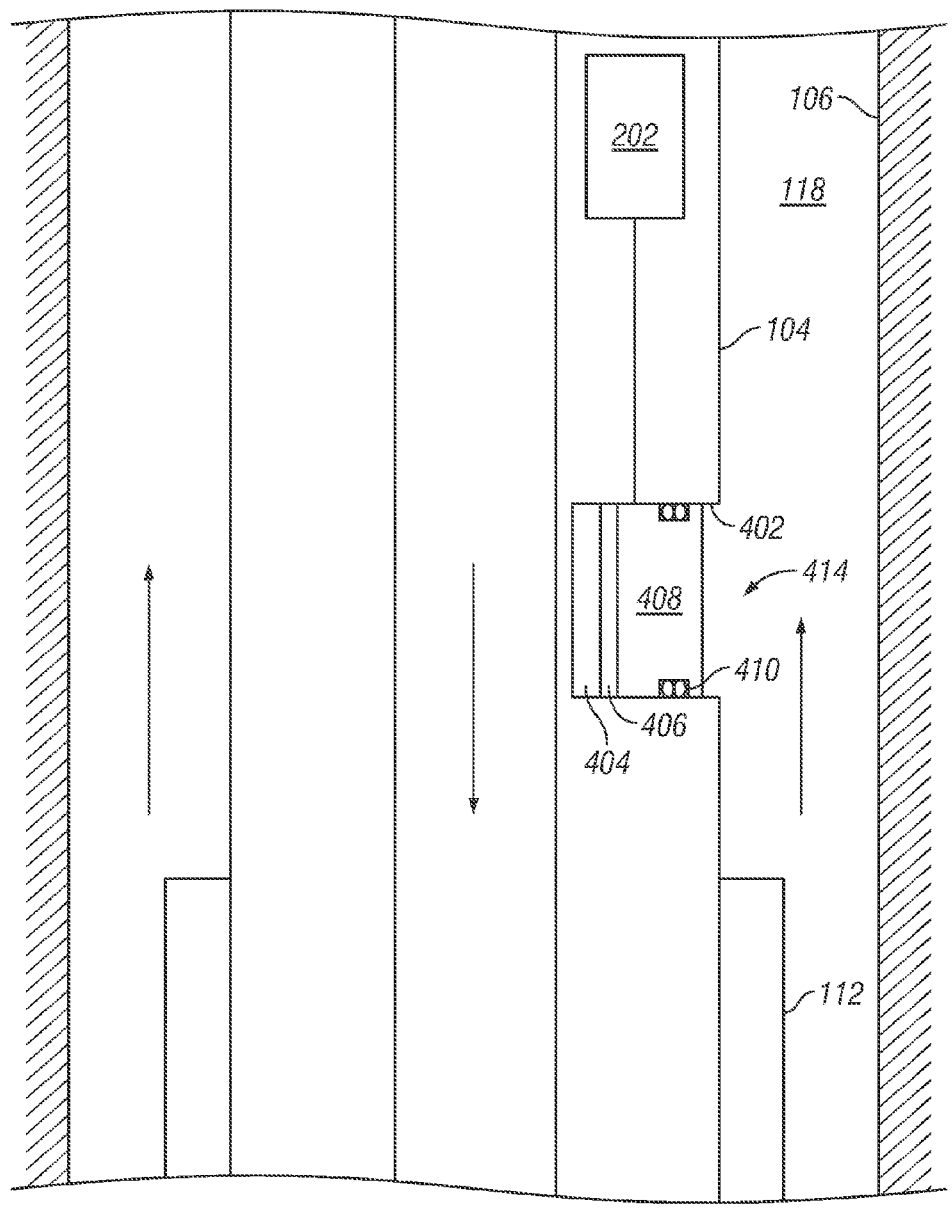
FIG. 4 is a cross-sectional view of an embodiment of a power generator sub including a thermoelectric generator.

A cross-section of another example of a power generator 414 is illustrated in FIG. 4. This example includes at least a cavity 402 on the drill string 104. The cavity 204 is disposed in location proximate to wear band 112 to minimize erosion of the power generator sub from drilling fluid 118 flow. A thermal insulator 404 is disposed in the cavity 402. The thermal insulator 404 is preferably a non-metallic material. Non-limiting examples of such materials include polyamideimide, polyphenylene, or polyetherketone, and ceramics or ceramic composites like calcium silicate, fiber glass composite, or metal oxide. The thermal insulator 404 insulates the power generator 414, so that instead of heat being conducted around the power generator 414, it is preferentially conducted through the power generator 414.

A thermoelectric generator 406 is disposed on the thermal insulator 404. A thermal conductor 408 is disposed on the thermoelectric generator 406. The power generator 414 may be sealed against the interior of the drill string 104 by a sealing element 410, such as an O-ring together with backup ring. The selected grades used must be suitable for the intended operating conditions. The thermoelectric generator 406 may be composed of highly doped semiconductor materials. Non-limiting examples of such materials may include any elements, alone or in combination, selected from Groups II, III, IV, V, and VI of the Periodic Table of Elements. Particular examples of elements include silicon, germanium, arsenic, zinc, tellurium, and lead. Particular examples of compounds may include bismuth telluride and lead telluride. The selection of materials will depend, at least in part, on the operating temperatures and pressures downhole.

During operation in the wellbore 106, heat is generated on the surface of the drill string 104. The heat is trapped on the surface of the thermal conductor 408 and flows to the thermoelectric generator 406 through thermal conduction. Accordingly, the thermal conductor 408 acts as a heat source on one side of the thermoelectric generator 406, i.e., the hot side. The thermal insulator 404, which is installed on the other side of the thermoelectric generator, i.e., the cold side, keeps minimal heat from conducting on the cold side of the thermoelectric generator 406. As a result, there is a thermal gradient formed between the hot and cold sides of the thermoelectric generator 406. The thermal gradient results in diffusion of electrons in the thermoelectric generator 406. This flow of electrons generates a voltage potential across the thermoelectric generator 406 due to the Seebeck effect. The potential difference created between the sides of the thermoelectric generator 406 can be utilized to provide electrical power to a downhole tool or stored. In the illustrated embodiment, the electrical power generated in the power generator 414 is conditioned by power conditioning unit 202.

Figure 5:
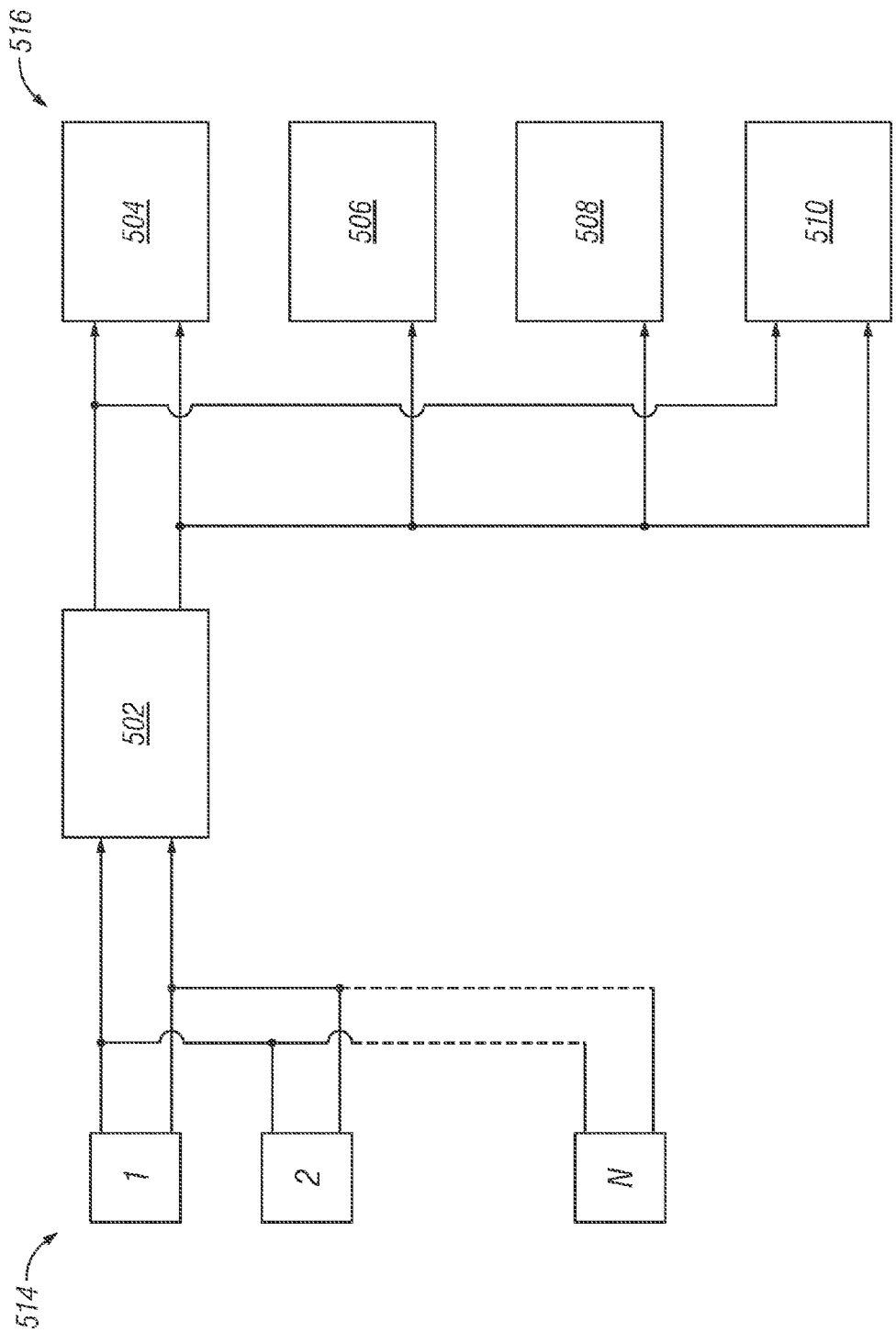
FIG. 5 is a schematic view of an embodiment of a thermoelectric power assembly including power generators, a power conditioning unit, and loads.

FIG. 5 is a schematic representation of a thermoelectric assembly, including power generators 514, a power conditioning unit 502, and multiple loads requiring power 506. As a single power generator 514 may not be suitable for supplying enough power to a load in every instance, the power generators 514 shown in FIG. 5 are fed in parallel (1, 2, . . . to N) to a power conditioning unit. The power conditioning unit may comprise a rectifier, booster circuit, smoothing and filtering circuit. The power conditioner 502 improves the quality of the power and then provides the power to the respective loads 506. For instance, the power conditioner 502 may provide power to components of downhole tools, such as electronics and sensors 504. The power from the power conditioner 502 may also be used to charge capacitors 506, supercapacitors 508, or rechargeable batteries 510.

Figure 6:
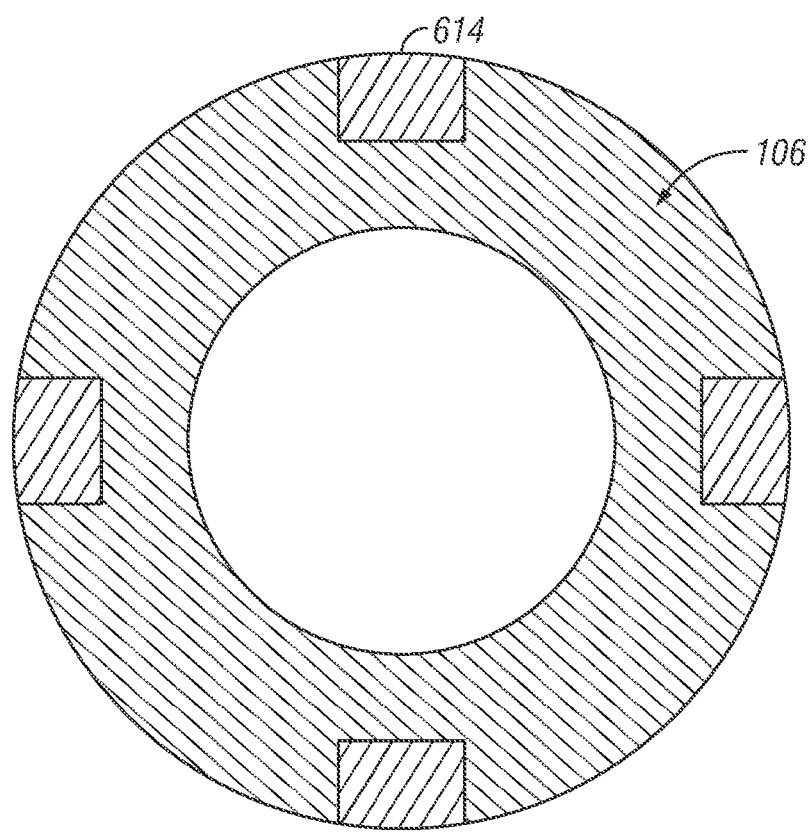
FIG. 6 is as top cross-sectional view of an embodiment of a power generator sub.

FIG. 6 is a cross-sectional top-view of a power generator sub. In the illustrated embodiment, four power generators 614 are disposed around the circumference of the drill string 106. The power generators 614 are shown disposed at 90° intervals around the drill string 106. However, the power generators 614 could be disposed in any number and at any interval about the drill string 106.

In addition to the embodiments described above, many examples of specific combinations are within the scope of the disclosure, some of which are detailed below:

EXAMPLE 1

A system for providing electrical power in a wellbore comprising:
  a drill string disposed within the wellbore comprising an outer surface defining an annular space between the drill string and the wellbore; and
  a power generator sub disposed in a cavity on the outer surface of the drill string, the generator sub comprising:

a thermoelectric generator; and
a thermal insulator disposed adjacent to and radially inward from the thermal generator,
wherein the power generator sub is in contact with a drilling fluid flowing through the annular space.

EXAMPLE 2

The system of example 1, the power generator sub further comprising a hot side disposed on a side in contact with the drilling fluid and a cold side on the opposing side.

EXAMPLE 3

The system of example 1, further comprising a plurality of power generator subs disposed on the outer surface of the drill string.

EXAMPLE 4

The system of example 4, wherein the plurality of power generator subs are coupled in parallel.

EXAMPLE 5

The system of example 4, wherein the plurality of power generator subs are coupled in series.

EXAMPLE 6

The system of example 1, further comprising a power conditioning unit.

EXAMPLE 7

The system of example 1, wherein the power generator sub is disposed proximate a wear band disposed on the drill string.

EXAMPLE 8

The system of example 1, the power generator sub further comprising a thermal conductor disposed adjacent to and radially outward from the thermoelectric generator.

EXAMPLE 9

The system of example 8, wherein a voltage potential is generated across the thermoelectric generator by way of a thermal path across the thermoelectric generator.

EXAMPLE 10

The system of example 9, further comprising a downhole tool, the downhole tool comprising electronics and sensors configured to be powered at least in part by the voltage potential.

EXAMPLE 11

The system of example 9, further comprising a capacitor, the capacitor configured to be charged at least in part by the voltage potential.

EXAMPLE 12

The system of example 1, the thermoelectric power generator further comprising two materials comprising different Seebeck coefficients.

EXAMPLE 13

The system of example 12, wherein a voltage potential is generated across the two materials by way of a thermal path created across the two materials.

EXAMPLE 14

The system of example 13, further comprising a downhole tool, the downhole tool comprising electronics and sensors configured to be powered at least in part by the voltage potential.

EXAMPLE 15

The system of example 13, further comprising a capacitor, the capacitor configured to be charged at least in part by the voltage potential.

EXAMPLE 16

A power generator sub apparatus disposed in a cavity on an outer surface of a drill string comprising:
a thermoelectric generator; and
a thermal insulator disposed adjacent to and radially inward from the thermal generator,
wherein the power generator sub is in contact with a drilling fluid flowing through the annular space.

EXAMPLE 17

The apparatus of example 16, the power generator further comprising a hot side disposed on a side in contact with the drilling fluid and a cold side on the opposing side.

EXAMPLE 18

The apparatus of example 16, further comprising a plurality of power generators disposed on the outer surface of the drill string.

EXAMPLE 19

The apparatus of example 18, wherein the plurality of power generators are coupled in parallel.

EXAMPLE 20

The apparatus of example 18, wherein the plurality of power generators are coupled in series.

EXAMPLE 21

The apparatus of example 16, further comprising a power conditioning unit.

EXAMPLE 22

The apparatus of example 16, wherein the power generator is disposed proximate a wear band disposed on the drill string.

EXAMPLE 23

The apparatus of example 16, the power generator sub further comprising a thermal conductor disposed adjacent to and radially outward from the thermoelectric generator.

EXAMPLE 24

The apparatus of example 23, wherein a voltage potential is generated across the thermoelectric generator by way of a thermal path across the thermoelectric generator.

EXAMPLE 25

The apparatus of example 24, further comprising a downhole tool, the downhole tool comprising electronics and sensors configured to be powered at least in part by the voltage potential.

EXAMPLE 26

The apparatus of example 24, further comprising a capacitor, the capacitor configured to be charged at least in part by the voltage potential.

EXAMPLE 27

The apparatus of example 16, the thermoelectric generator further comprising two materials comprising different Seebeck coefficients.

EXAMPLE 28

The apparatus of example 27, wherein a voltage potential is generated across the two materials by way of a thermal path created across the two materials.

EXAMPLE 29

The apparatus of example 28, further comprising a downhole tool, the downhole tool comprising electronics and sensors configured to be powered at least in part by the voltage potential.

EXAMPLE 30

The apparatus of example 28, further comprising a capacitor, the capacitor configured to be charged at least in part by the voltage potential.

EXAMPLE 31

A method for providing electrical power in a wellbore comprising:
providing a thermoelectric power generator on the outer surface of a drill string, the power generator being in contact with drilling fluid flowing through an annular space outside the drill string; and
converting thermal energy of the drilling fluid into electrical power using Seebeck effect to create a voltage potential across the power generator.

While the aspects of the present disclosure may be susceptible to various modifications and alternative forms, specific embodiments have been shown by way of example in the drawings and have been described in detail herein. But it should be understood that the invention is not intended to be limited to the particular forms disclosed. Rather, the invention is to cover all modifications, equivalents, and alternatives falling within the spirit and scope of the invention as defined by the following appended claims.

We claim:

1. A system for providing electrical power in a wellbore comprising:
a power generator sub comprising:
a thermoelectric power generator comprising:
a first contact surface comprising a first material is contactable by a fluid; and
a second contact surface in direct contact with the first contact surface, the second contact surface comprising a second material is contactable by the fluid at substantially the same temperature, wherein the first material and second material have different Seebeck coefficients to generate a temperature gradient and thermoelectric power generation.

2. The system of claim 1, the power generator sub further comprising a thermal insulator positioned adjacent to and radially inward from the first contact surface and the second contact surface.

3. The system of claim 1, further comprising:
a drill string disposed within the wellbore comprising an outer surface defining the annular space, wherein the annular space is located between the drill string and the wellbore; and
a plurality of the power generator subs located on the outer surface of the drill string.

4. The system of claim 3, wherein the plurality of power generator subs is coupled in parallel.

5. The system of claim 3, wherein the plurality of power generator subs is coupled in series.

6. The system of claim 1, further comprising a power conditioning unit.

7. The system of claim 1, wherein the power generator sub is located proximate to a wear band positioned on a drill string.

8. The system of claim 1, the power generator sub further comprising a thermal conductor located adjacent to and radially outward from the thermoelectric power generator.

9. The system of claim 8, wherein a voltage potential is generated across the thermoelectric power generator by way of a thermal path across the thermoelectric power generator.

10. The system of claim 9, further comprising a downhole tool, the downhole tool comprising electronics and sensors configured to be powered at least in part by the voltage potential.

11. The system of claim 9, further comprising a capacitor, the capacitor configured to be charged at least in part by the voltage potential.

12. The system of claim 1, wherein the fluid is a drilling fluid.

13. The system of claim 1, wherein a voltage potential is generated across the two materials by way of a thermal path created across the two materials.

14. The system of claim 13, further comprising a downhole tool, the downhole tool comprising electronics and sensors configured to be powered at least in part by the voltage potential.

15. The system of claim 13, further comprising a capacitor, the capacitor configured to be charged at least in part by the voltage potential.

16. A method for providing electrical power in a wellbore, comprising:
providing a thermoelectric power generator on the outer surface of a drill string into the wellbore;

exposing a first contact surface of the thermoelectric power generator comprising a first material to drilling fluid flowing through an annular space outside of the drill string;

exposing a second contact surface of the thermoelectric power generator to the drilling fluid at the same temperature, the second contact surface being in direct contact with the first contact surface and comprising a second material having a different Seebeck coefficient than the first material; and converting thermal energy of the drilling fluid into electrical power using the different Seebeck coefficients of the first and second materials to create a voltage potential across the thermoelectric power generator.

17. The method of claim 16, the thermoelectric power generator further comprising a thermal insulator positioned adjacent to and radially inward from the first contact surface and the second contact surface.

18. The method of claim 16, wherein the voltage potential is generated across the two materials by way of a thermal path created across the two materials.

19. The method of claim 18, further comprising a downhole tool, the downhole tool comprising electronics and sensors that are powered at least in part by the voltage potential.

20. The method of claim 18, further comprising a capacitor that is charged at least in part by the voltage potential.

* * * * *